(12) United States Patent
Uesaka et al.

(10) Patent No.: US 7,456,613 B2
(45) Date of Patent: Nov. 25, 2008

(54) BATTERY REMAINING CAPACITY CALCULATING METHOD, BATTERY REMAINING CAPACITY CALCULATING DEVICE, AND BATTERY REMAINING CAPACITY CALCULATING PROGRAM

(75) Inventors: Shinichi Uesaka, Kanagawa (JP); Nozomu Mitsuyoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 52 days.

(21) Appl. No.: 10/566,058

(22) PCT Filed: Jul. 27, 2004

(86) PCT No.: PCT/JP2004/011023
§ 371 (c)(1),
(2), (4) Date: Mar. 3, 2006

(87) PCT Pub. No.: WO2005/024446
PCT Pub. Date: Mar. 17, 2005

(65) Prior Publication Data
US 2007/0114971 A1 May 24, 2007

(51) Int. Cl.
*H02J 7/00* (2006.01)
(52) U.S. Cl. .................. 320/132; 324/432; 324/433
(58) Field of Classification Search ................ 320/106, 320/125, 128, 132, 136, 137, 160, 134, 116, 320/DIG. 17, DIG. 21; 429/90; 324/427, 324/431, 771, 433, 434, 432
See application file for complete search history.

(56) References Cited

U.S. PATENT DOCUMENTS 2,864,055 A * 12/1958 Kordesch et al. ............ 324/427
4,725,784 A * 2/1988 Peled et al. ................ 324/427
5,473,262 A * 12/1995 Yoshimatsu ................ 324/771

(Continued)

FOREIGN PATENT DOCUMENTS

JP 60-066171 4/1985

(Continued)

*Primary Examiner*—Akm Enayet Ullah
*Assistant Examiner*—M'Baye Diao
(74) *Attorney, Agent, or Firm*—Bell, Boyd & Lloyd LLP

(57) ABSTRACT

A battery remaining capacity calculating method, a battery remaining capacity calculating device, and a battery remaining capacity calculating program that make it possible to estimate the remaining capacity of a secondary battery with high accuracy using a relatively simple circuit configuration are provided. An output voltage value of the secondary battery is measured, a use mode of the secondary battery is divided into a high consumption mode in which the output voltage value is not lower than a threshold value and a low consumption mode in which the output voltage value is lower than the threshold value, a remaining capacity in the low consumption mode is calculated on a basis of a predetermined reference voltage curve as a discharge characteristic of the secondary battery and the output voltage value, and a remaining capacity in the high, consumption mode is calculated supposing that there is little change in the remaining capacity at a time of change from the low consumption mode to the high consumption mode. In the high consumption mode, the remaining capacity may be calculated on a basis of a reference remaining capacity as a remaining capacity before the use mode change, a start voltage as an output voltage at a time of a start of the high consumption mode, a predetermined cutoff voltage of the secondary battery, and the output voltage value.

15 Claims, 8 Drawing Sheets

U.S. PATENT DOCUMENTS

| | | | | |
|---|---|---|---|---|
| 5,493,197 A | * | 2/1996 | Eguchi et al. | 320/116 |
| 5,703,486 A | * | 12/1997 | Arai et al. | 324/427 |
| 5,834,923 A | * | 11/1998 | Lewin et al. | 320/147 |
| 5,847,566 A | * | 12/1998 | Marritt et al. | 324/427 |
| 5,872,453 A | * | 2/1999 | Shimoyama et al. | 324/431 |
| 5,912,544 A | * | 6/1999 | Miyakawa et al. | 320/106 |
| 5,926,008 A | * | 7/1999 | Palanisamy et al. | 320/132 |
| 6,064,182 A | * | 5/2000 | Eguchi | 320/132 |
| 6,094,032 A | * | 7/2000 | Bariand et al. | 320/125 |
| 6,174,617 B1 | * | 1/2001 | Hiratsuka et al. | 429/90 |
| 6,191,558 B1 | * | 2/2001 | Arai et al. | 320/132 |
| 6,194,874 B1 | * | 2/2001 | Kalogeropoulos et al. | 320/160 |
| 2001/0040443 A1 | * | 11/2001 | Suzuki et al. | 320/134 |
| 2003/0122524 A1 | * | 7/2003 | Rhee et al. | 320/128 |
| 2003/0169017 A1 | * | 9/2003 | Ariga et al. | 320/125 |
| 2003/0169020 A1 | * | 9/2003 | Malcolm | 320/136 |

FOREIGN PATENT DOCUMENTS

| | | |
|---|---|---|
| JP | 07-131410 | 5/1995 |
| JP | 08-237336 | 9/1996 |
| JP | 2000-092721 | 3/2000 |
| JP | 2000-92721 | 3/2000 |
| JP | 2002-214310 | 7/2002 |

* cited by examiner

| REMAINING CAPACITY LEVEL (Q) | VOLTAGE (V) |
|---|---|
| 10 | 4.10 |
| 9 | 4.03 |
| ⋮ | ⋮ |
| 1 | 3.55 |

FIG.8
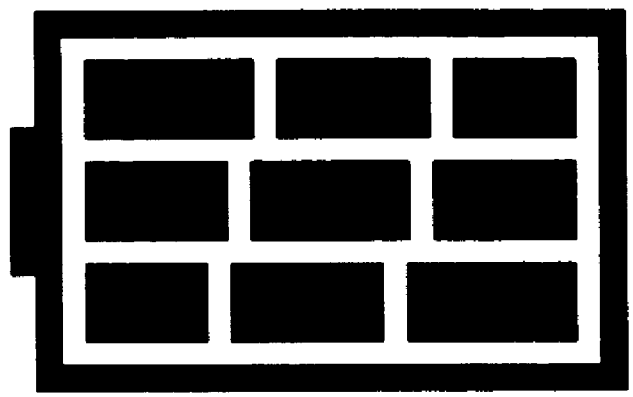
REMAINING CAPACITY LEVEL 10
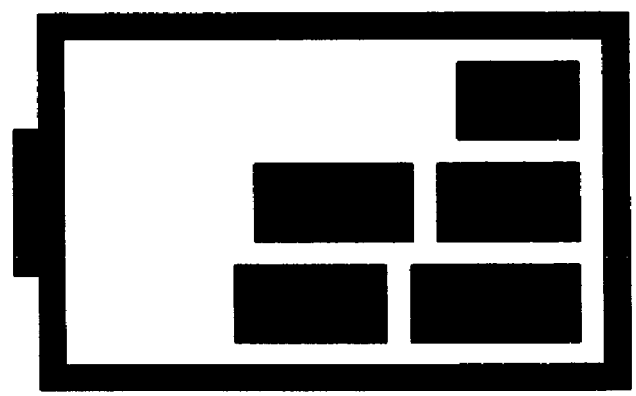
REMAINING CAPACITY LEVEL 6
REMAINING CAPACITY LEVEL 1

BATTERY REMAINING CAPACITY CALCULATING METHOD, BATTERY REMAINING CAPACITY CALCULATING DEVICE, AND BATTERY REMAINING CAPACITY CALCULATING PROGRAM

CROSS REFERENCE TO RELATED APPLICATIONS

The present application claims priority to Japanese Patent Document No. P2003-310461 filed on September 2, 2003, the disclosure of which is herein incorporated by reference.

The present invention relates to a battery remaining capacity calculating method, a battery remaining capacity calculating device, and a battery remaining capacity calculating program for calculating a useable quantity of electricity of a secondary battery.

A portable telephone has recently incorporated not only a conventional calling function but also an electronic mail function, a digital camera function and the like, and is thus changing into a high-functionality portable type multi-function electronic device. The portable telephone is driven by a battery formed by a secondary battery such for example as a lithium-ion secondary battery. For a user of the portable telephone to use the portable telephone without worries, an accurate remaining capacity of the battery needs to be notified to the user. This is because an exhaustion of the battery of the portable telephone during a time when the user is out is a problem that the user most wants to avoid and if the user correctly knows the remaining capacity of the battery, the user can prevent battery exhaustion. However, display of the remaining capacity of the portable telephone is generally three-level display as shown in FIG. 10, which cannot be said to satisfy needs of the user.

The remaining capacity in the portable telephone is conventionally performed by measuring only the voltage of the battery and comparing the voltage with a reference value. However, relation between the voltage and the remaining capacity is not a one-to-one relationship, so that with this calculating method, the remaining capacity cannot be displayed correctly. Thus the remaining capacity calculating method in a present situation often causes a problem of an increase in the remaining capacity displayed even when the portable telephone is used. It is therefore difficult to change remaining capacity display from present three-level display to more detailed display, for example 10-level display. While a method for solving the problem of an increase in the remaining capacity displayed is proposed, the method does not essentially improve the accuracy of the remaining capacity (see for example Japanese Patent Laid-open No. Hei 8-237336).

On the other hand, two methods, that is, a current integration method and a voltage method are proposed as methods for calculating the remaining capacity of a battery with high accuracy. The current integration method calculates a present remaining capacity by subtracting the integrated value of discharged current from a full charge capacity. However, characteristics of current variations of the portable telephone or the like lie in that a current during a standby time, which accounts for a longest time in states in which the portable telephone is used, and a current during a call time differ by 100 times or more and in that a pulse-like current flows. Therefore, to measure and integrate such currents accurately requires a high-precision current measuring circuit having a wide dynamic range and an excellent frequency characteristic. It is thus impractical to apply such a circuit to a small portable type electronic device such as a portable telephone or the like.

In the voltage method, on the other hand, relation between the voltage and the remaining capacity is measured in advance under various conditions, and a voltage measured during actual use is compared with the above relation, whereby the remaining capacity is calculated. It is proposed to store remaining capacities corresponding to combinations of voltages and currents as a large-number table and compare a measured voltage and a measured current with the table to thereby calculate a remaining capacity, and also to correct the value according to temperature and a state of degradation of the battery (see for example Japanese Patent Laid-open No. 2002-214310).

As pointed out by Japanese Patent Laid-open No. 2002-214310, a secondary battery greatly varies relation between the voltage and the remaining capacity depending on use conditions of current, the temperature, a state of degradation and the like. It is therefore necessary to measure the relation between the voltage and the remaining capacity under many conditions corresponding to the use conditions and then create a table. However, the table created with such an extensive effort is generally obtained by experiments with constant-current discharge or constant-power discharge, and is thus far removed from actual use conditions of the portable telephone.

That is, even with a same current, a same temperature, and a same state of degradation, the relation between the voltage and the remaining capacity varies depending on a use history indicating how the portable telephone is used, for example indicating that a call is started after a standby state. Thus, when calculating a remaining capacity in an actual use environment in which use conditions always change, a method using a table created under ideal discharge conditions such as constant-current discharge conditions or constant-power discharge conditions has a low accuracy in the calculation.

Another method combining the current integration method and the voltage method is proposed. This method calculates a remaining capacity using the voltage method for a standby time when accurate current integration is difficult to be calculated and using the current integration method during a call time and the like when current is high (see for example Japanese Patent Laid-open No. 2002-181906). The method is intended to reduce the number of tables necessary for the voltage method by using the voltage method only at a standby time and calculate a remaining capacity with high accuracy by using the current integration method at a call time. However, this invention also requires the use of the current integration method, and therefore requires a high-precision current measuring circuit.

As described above, the remaining capacity calculating method measuring only voltage as disclosed in Japanese Patent Laid-open No. Hei 8-237336 has an advantage of being able to calculate a remaining capacity with a relatively simple circuit configuration. However, because of the poor calculation accuracy of the remaining capacity calculating method, it is difficult to display a remaining capacity for a user more minutely than in remaining capacity display in a present situation.

In addition, when a battery remaining capacity is to be calculated with high accuracy, both of the conventional current integration method and the conventional voltage method require a current measurement, and require a circuit for the current measurement. Further, considering characteristics of current variations of the portable telephone or the like, even when such a circuit is used, it is difficult to measure and integrate current with high accuracy. It is therefore impossible in practice to realize high-precision remaining capacity estimation using the current integration method.

SUMMARY

It is accordingly an object of the present invention to provide a battery remaining capacity calculating method, a battery remaining capacity calculating device, and a battery remaining capacity calculating program that make it possible to estimate the remaining capacity of a secondary battery with high accuracy using a relatively simple circuit configuration.

In order to solve the above problems, according to the present invention, there is provided a battery remaining capacity calculating method for calculating a remaining capacity as a capacity of electricity dischargeable by a secondary battery, the battery remaining capacity calculating method including: a voltage measuring step of measuring an output voltage value of the secondary battery; a mode determining step of dividing a use mode of the secondary battery into a high consumption mode in which the output voltage value is not lower than a threshold value and a low consumption mode in which the output voltage value is lower than the threshold value; a low consumption time remaining capacity calculating step of calculating a remaining capacity in the low consumption mode on a basis of a predetermined reference voltage curve as a discharge characteristic of the secondary battery and the output voltage value; and a high consumption time remaining capacity calculating step of calculating a remaining capacity in the high consumption mode supposing that there is little change in the remaining capacity at a time of change from the low consumption mode to the high consumption mode.

By dividing the use mode of the secondary battery into the high consumption mode in which the output voltage value is not lower than the threshold value and the low consumption mode in which the output voltage value is lower than the threshold value, calculating a remaining capacity in the low consumption mode from the reference voltage curve, and supposing that change in the remaining capacity at a time of change in the use mode is zero, a voltage change caused by an effect of an internal impedance of the secondary battery can be removed for remaining capacity calculation. In addition, since the discharge characteristic in the low consumption mode can be represented by using one reference voltage curve, it is possible to reduce a capacity of characteristic information, and reduce a storage capacity necessary to calculate the battery remaining capacity.

Additional features and advantages of the present invention are described in, and will be apparent from, the following Detailed Description and the Figures.

The battery remaining capacity calculating method according to the present invention further includes an initializing step of setting a reference remaining capacity as a remaining capacity before the use mode change and a start voltage as an output voltage at a time of a start of the high consumption mode, wherein in the high consumption time remaining capacity calculating step, a remaining capacity is calculated on a basis of the reference remaining capacity, the start voltage, a predetermined cutoff voltage of the secondary battery, and the output voltage value. Since the remaining capacity is calculated on the basis of the reference remaining capacity, the start voltage, and the cutoff voltage, it is possible to only measure the output voltage value also in the high consumption mode to calculate the remaining capacity accurately and minutely. In addition, since only the voltage measurement is performed to calculate the remaining capacity, a need for a sophisticated ammeter ready for pulse-like current changes is eliminated. Therefore a configuration for realizing the battery remaining capacity calculating method according to the present invention can be simplified.

The remaining capacity Qm in the high consumption mode may be calculated by an equation $$Qm = Qn - Qn\frac{(Vn - Vm)}{(Vn - Vt)} = Qn\left(\frac{Vm - Vt}{Vn - Vt}\right)$$

using the reference remaining capacity Qn, the start voltage Vn, the cutoff voltage Vt, and the output voltage value Vm. Since the remaining capacity in the high consumption mode can be calculated by the simple equation, a sophisticated arithmetic device as a circuit for performing an operation is not required. In addition, since the effect of the internal impedance of the secondary battery depending on a use environment and a use history can be removed in calculating the remaining capacity, it is possible to eliminate a need to store a large capacity of discharge characteristic data, and reduce a storage capacity necessary to calculate the battery remaining capacity.

The battery remaining capacity calculating method according to the present invention further includes an initializing step of setting a voltage gap as an output voltage change at the time of the use mode change, wherein in the high consumption time remaining capacity calculating step, a remaining capacity is calculated on a basis of the voltage gap and the output voltage value. The voltage gap is changed by the effect of the internal impedance when the use mode of the secondary battery is changed. Therefore, by calculating the remaining capacity on the basis of the voltage gap and the output voltage, it is possible to remove the effect of the internal impedance and calculate the remaining capacity accurately and minutely.

In addition, an addition voltage value (Vm+ΔV) may be calculated by adding the voltage gap ΔV to the output voltage value Vm, and a remaining capacity at the addition voltage value (Vm+ΔV) on the reference voltage curve may be set as the remaining capacity Qm in the high consumption mode. Since the addition voltage value is calculated and the remaining capacity is calculated on the basis of the reference voltage curve and the addition voltage value, it is possible to perform the calculation of the remaining capacity with the effect of the internal impedance removed supposing that there is no voltage gap as the voltage change at the time of the use mode change of the secondary battery.

Whether the secondary battery is in the low consumption mode or in the high consumption mode can be determined in the mode determining step by measuring an output current value of the secondary battery, detecting a change in output voltage of the secondary battery, and obtaining information from an electronic device side to which the secondary battery supplies power, for example. When information is exchanged with the electronic device, constituent parts for detecting the use mode can be simplified. In addition, even when consumed current is detected to make the determination, high-precision measurement is not required, and thus manufacturing cost can be reduced.

In addition, in order to solve the above problems, according to the present invention, there is provided a battery remaining capacity calculating device for calculating a remaining capacity as a capacity of electricity dischargeable by a secondary battery, the battery remaining capacity calculating device including: voltage measuring means for measuring an output voltage value of the secondary battery; and arithmetic means for performing information processing, a reference voltage curve as a discharge characteristic of the secondary battery being recorded in the arithmetic means; wherein the arithmetic means divides a use mode of the secondary battery into a high consumption mode in which the output voltage value is not lower than a threshold value and a low consumption mode in which the output voltage value is lower than the threshold value, the arithmetic means calculates a remaining capacity of the secondary battery in the low consumption mode on a basis of the voltage value measured by the voltage measuring means and the reference voltage curve, and the arithmetic means calculates a remaining capacity in the high consumption mode on a basis of a reference remaining capacity as a remaining capacity before a use mode change, a start voltage as an output voltage at a time of a start of the high consumption mode, a predetermined cutoff voltage of the secondary battery, and the output voltage value.

Since the remaining capacity is calculated on the basis of the reference remaining capacity, the start voltage, and the cutoff voltage, it is possible to only measure the output voltage value also in the high consumption mode to calculate the remaining capacity accurately and minutely. In addition, since only the voltage measurement is performed to calculate the remaining capacity, a need for a sophisticated ammeter ready for pulse-like current changes is eliminated. Therefore a configuration for realizing the battery remaining capacity calculating method according to the present invention can be simplified. The remaining capacity Qm in the high consumption mode may be calculated by an equation $$Qm = Qn - Qn\frac{(Vn - Vm)}{(Vn - Vt)} = Qn\left(\frac{Vm - Vt}{Vn - Vt}\right)$$

using the reference remaining capacity Qn, the start voltage Vn, the cutoff voltage Vt, and the output voltage value Vm. Since the remaining capacity in the high consumption mode can be calculated by the simple equation, a sophisticated arithmetic device as a circuit for performing an operation is not required. In addition, since the effect of the internal impedance of the secondary battery depending on a use environment and a use history can be removed in calculating the remaining capacity, it is possible to eliminate a need to store a large capacity of discharge characteristic data, and reduce a storage capacity necessary to calculate the battery remaining capacity.

In addition, in order to solve the above problems, according to the present invention, there is provided a battery remaining capacity calculating device for calculating a remaining capacity as a capacity of electricity dischargeable by a secondary battery, the battery remaining capacity calculating device including: voltage measuring means for measuring an output voltage value of the secondary battery; and arithmetic means for performing information processing, a reference voltage curve as a discharge characteristic of the secondary battery being recorded in the arithmetic means; wherein the arithmetic means divides a use mode of the secondary battery into a high consumption mode in which the output voltage value is not lower than a threshold value and a low consumption mode in which the output voltage value is lower than the threshold value, the arithmetic means calculates a remaining capacity of the secondary battery in the low consumption mode on a basis of the voltage value measured by the voltage measuring means and the reference voltage curve, and the arithmetic means calculates a remaining capacity in the high consumption mode on a basis of a voltage gap as an output voltage change at a time of a use mode change and the output voltage value.

The voltage gap is changed by the effect of the internal impedance when the use mode of the secondary battery is changed. Therefore, by calculating the remaining capacity on the basis of the voltage gap and the output voltage, it is possible to remove the effect of the internal impedance and calculate the remaining capacity accurately and minutely. In addition, an addition voltage value (Vm+ΔV) may be calculated by adding the voltage gap ΔV to the output voltage value Vm, and a remaining capacity at the addition voltage value (Vm+ΔV) on the reference voltage curve may be set as the remaining capacity Qm in the high consumption mode. Since the addition voltage value is calculated and the remaining capacity is calculated on the basis of the reference voltage curve and the addition voltage value, it is possible to perform the calculation of the remaining capacity with the effect of the internal impedance removed supposing that there is no voltage gap as the voltage change at the time of the use mode change of the secondary battery.

In order to solve the above problems, according to the present invention, there is provided a battery remaining capacity calculating program for calculating a remaining capacity as a capacity of electricity dischargeable by a secondary battery, the battery remaining capacity calculating program including making a processor perform: a voltage measuring step of measuring an output voltage value of the secondary battery; a mode determining step of dividing a use mode of the secondary battery into a high consumption mode in which the output voltage value is not lower than a threshold value and a low consumption mode in which the output voltage value is lower than the threshold value; a low consumption time remaining capacity calculating step of calculating a remaining capacity in the low consumption mode on a basis of a predetermined reference voltage curve as a discharge characteristic of the secondary battery and the output voltage value; and a high consumption time remaining capacity calculating step of calculating a remaining capacity in the high consumption mode supposing that there is little change in the remaining capacity at a time of change from the low consumption mode to the high consumption mode.

By dividing the use mode of the secondary battery into the high consumption mode in which the output voltage value is not lower than the threshold value and the low consumption mode in which the output voltage value is lower than the threshold value, calculating a remaining capacity in the low consumption mode from the reference voltage curve, and supposing that change in the remaining capacity at a time of change in the use mode is zero, a voltage change caused by an effect of an internal impedance of the secondary battery can be removed for remaining capacity calculation. In addition, since the discharge characteristic in the low consumption mode can be represented by using one reference voltage curve, it is possible to reduce a capacity of characteristic information, and reduce a storage capacity necessary to calculate the battery remaining capacity.

By dividing the use mode of the secondary battery into the high consumption mode in which the output voltage value is not lower than the threshold value and the low consumption mode in which the output voltage value is lower than the threshold value, calculating a remaining capacity in the low consumption mode from the reference voltage curve, and supposing that change in the remaining capacity at a time of change in the use mode is zero, a voltage change caused by an effect of an internal impedance of the secondary battery can be removed for remaining capacity calculation.

According to the present invention, a battery remaining capacity can be displayed for a user with high accuracy and in detail, and thus the convenience of the user can be improved. Further, since the user knows the accurate remaining capacity level of the secondary battery, the user can charge the secondary battery at an appropriate time. As a result, a time during which the portable type electronic device can be driven on one charge can be lengthened, so that the convenience of the user can be further improved. In addition, according to the present invention, a high-precision current measuring circuit is not required, and therefore the remaining capacity of the secondary battery can be estimated with high accuracy using a relatively simple circuit configuration. It is thus possible to reduce the number of parts of the electronic device, and to decrease the price of constituent parts. It is thus possible to reduce the cost of manufacturing the electronic device, and reduce the weight of the electronic device.

BRIEF DESCRIPTION OF THE FIGURES

FIG. 8 is a diagram showing images imitating a battery, for displaying a remaining capacity level Qm on a main body unit in a first example of the present invention;

DETAILED DESCRIPTION

A battery remaining capacity calculating method, a battery remaining capacity calculating device, and a battery remaining capacity calculating program to which the present invention is applied will hereinafter be described in detail with reference to the drawings. It is to be noted that the present invention is not limited to descriptions below, and changes may be made without departing from the spirit of the present invention. Incidentally, in the descriptions below, a remaining capacity refers to a quantity of electricity that can be discharged by a secondary battery, voltage refers to a value of voltage across the secondary battery, and current refers to a value of current that is discharged from the secondary battery or with which the secondary battery is charged. Also, a voltage at which power supply is stopped will be referred to as a cutoff voltage. In addition, as an indication of a remaining capacity, for example a remaining capacity level represented by a ratio with 100 for a fully charged state of the secondary battery and zero as a remaining capacity at the voltage at which power supply is stopped will be used. Since the remaining capacity level represents a ratio in a range from a fully charged state to a fully discharged state of the secondary battery, the calculation of the remaining capacity level is equivalent to the calculation of a quantity of electricity dischargeable by the secondary battery.

A battery remaining capacity calculating method according to the present invention distinguishes a low consumption mode in which a value of current output by a secondary battery is relatively low and an effect of internal impedance is negligible and a high consumption mode in which a value of current output by the secondary battery is relatively high and the effect of the internal impedance is not negligible, and calculates a remaining capacity level on the basis of a value of output voltage of the secondary battery in each mode.

First Embodiment

A portable telephone as an electronic device using a battery remaining capacity calculating method according to a present embodiment as a first embodiment of the present invention will be described with reference to FIGS. 1 to 5. It is to be noted that while description will be made of a portable telephone driven by a battery such as a secondary battery or the like, it is needless to say that the present embodiment is applicable to portable type electronic devices other than the portable telephone, that is, portable type electronic devices such for example as digital cameras, video cameras, and PDAs (Personal Digital Assistants).

Figure 1:
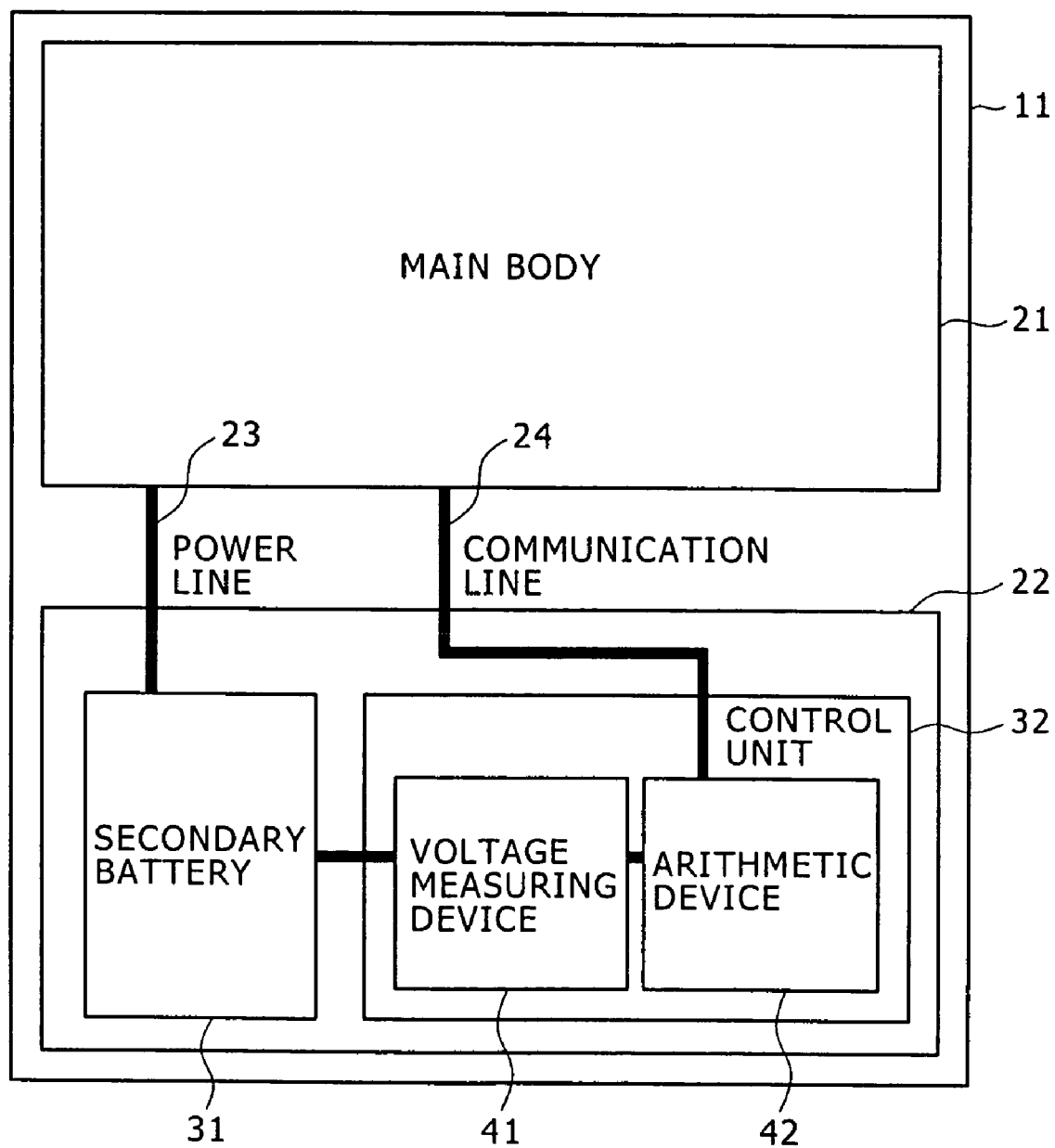
FIG. 1 is a block diagram showing an example of configuration of a portable telephone calculating the remaining capacity of a secondary battery using a battery remaining capacity calculating method according to a first embodiment of the present invention.

FIG. 1 is a block diagram showing an example of configuration of a portable telephone that calculates a remaining capacity of a secondary battery using the battery remaining capacity calculating method according to the present embodiment. The portable telephone 11 is formed by a main body unit 21 and a battery unit 22. A connection between the main body unit 21 and the battery unit 22 is made by a power line 23 for power supply and a communication line 24 for information exchange.

The main body unit 21 is an electronic device as a load that consumes power. The main body unit 21 includes elements provided for an ordinary portable telephone, such as an information processing circuit for controlling a telephone calling function, a liquid crystal screen for displaying information such as a remaining capacity of a battery, a call duration and the like, an antenna for communicating with a base station, and the like. The main body unit 21 may have only a calling function, or may have a plurality of functions such for example as an electronic mail function and a digital camera function.

The battery unit 22 includes for example a secondary battery 31 that can be charged and discharged, such as a lithium-ion secondary battery or the like, and a control unit 32 for calculating a remaining capacity and monitoring the battery for an abnormal state. Incidentally, while the battery unit 22 represents an example formed by one secondary battery, the battery unit 22 may be a cell set formed by a plurality of secondary batteries. In this case, the voltage of each secondary battery may be measured separately to calculate the remaining capacity of each secondary battery, or the voltage of the whole of the battery unit 22 may be measured to calculate the remaining capacity.

The control unit 32 includes a voltage measuring device 41 for measuring the voltage of the secondary battery 31 and an arithmetic device 42 for calculating a remaining capacity. The voltage measuring device 41 is formed by an AD converter, for example. The voltage measuring device 41 measures the voltage of the secondary battery 31, converts the measured analog voltage value into a digital value, and then transmits the voltage value to the arithmetic device 42. The arithmetic device 42 calculates a remaining capacity according to the measured voltage value of the secondary battery 31, and then transmits the result to the main body unit 21 of the portable telephone 11. The arithmetic device 42 includes an information processing circuit for performing arithmetic, a volatile storage device for temporarily storing data such as the measured voltage and the calculated remaining capacity, and a nonvolatile storage device for storing a program and a characteristic of the secondary battery 31. Incidentally, while in the configuration example shown in FIG. 1, the control unit 32 is separated from the main body unit 21 of the portable telephone 11, the control unit 32 may be incorporated into the main body unit 21 and control the battery unit 22.

Description will next be made of a measuring method for data stored in advance in the nonvolatile storage device of the arithmetic device 42. In the present embodiment, a relation between the voltage and the remaining capacity needs to be measured in advance and stored as data in order to calculate the remaining capacity by a voltage method at a standby time when the portable telephone 11 is not used. Accordingly, for example, a secondary battery of a same type as the secondary battery 31 included in the battery unit 22 is charged to a full charge voltage, and thereafter the relation between the voltage and the remaining capacity is measured while the secondary battery is discharged at a low-load current of 10 mA, for example, until a cutoff voltage is reached. Incidentally, it is desirable that the measurement at this time be performed at room temperature. A discharge characteristic as the relation between the voltage and the remaining capacity may be represented by some function, or a plurality of relations between the remaining capacity and voltage the may be represented as a table. The discharge characteristic measured in advance is stored in advance as a reference voltage curve in the nonvolatile storage device of the arithmetic device 42.

Figure 2:
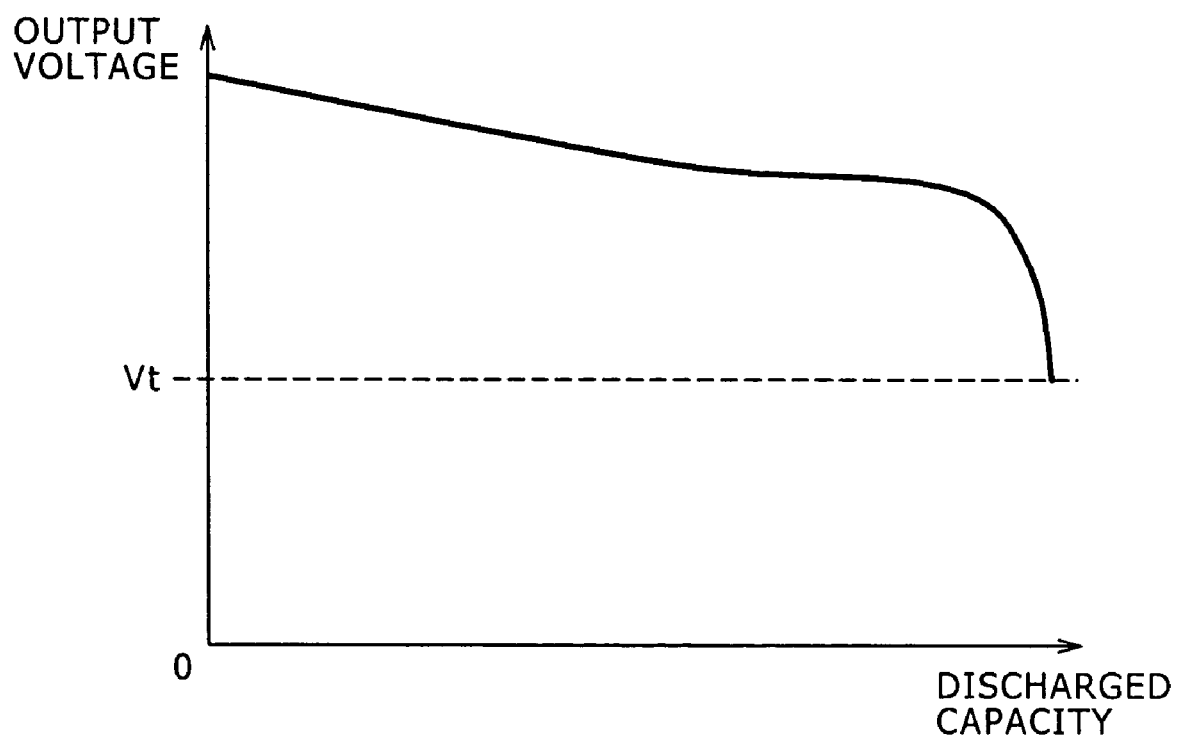
FIG. 2 is a graph showing an example of a reference voltage curve stored in advance in a volatile storage device of an arithmetic device in the first embodiment of the present invention.

FIG. 2 is a graph showing an example of the reference voltage curve stored in advance in the nonvolatile storage device of the arithmetic device 42 as described above. An axis of abscissas indicates a discharged capacity corresponding to the integrated value of a quantity of electricity discharged by the secondary battery 31. An axis of ordinates indicates the output voltage value of the secondary battery 31. After discharge in a low consumption mode is started in a full charge state in which the discharged capacity is zero, the discharged capacity increases with the passage of time, and as the discharged capacity increases, the output voltage decreases. A cutoff voltage Vt at which the discharging of the secondary battery 31 is stopped is recorded in the nonvolatile storage device of the arithmetic device 42.

Figures 3, 4:
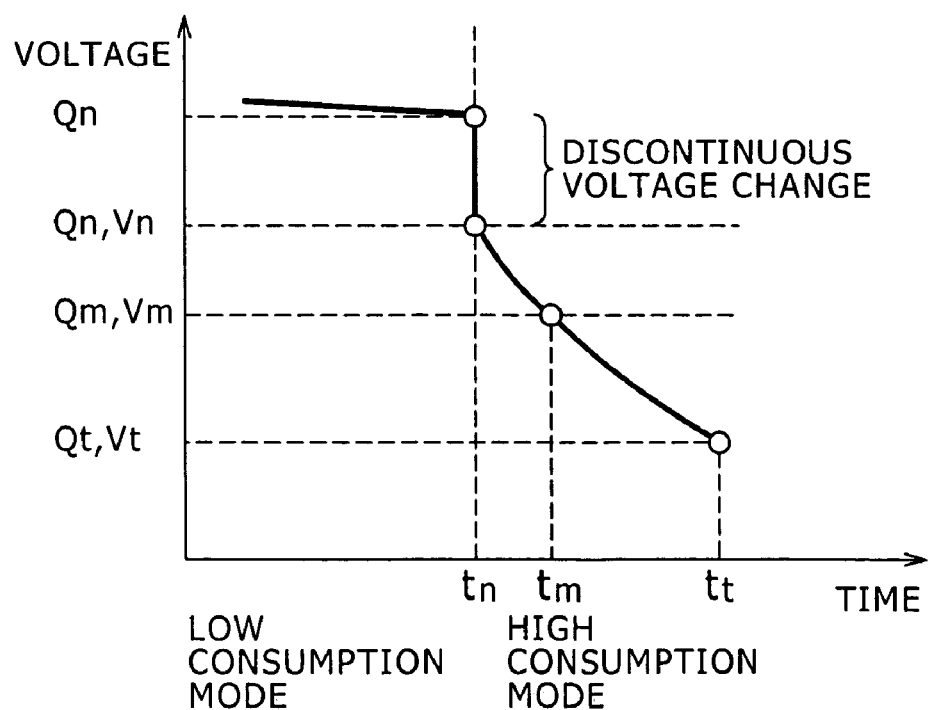
FIG. 3 is an example of a reference table indicating relation between a remaining capacity level Q set for each output voltage value of the secondary battery and an output voltage V in the first embodiment of the present invention.
FIG. 4 is a graph schematically showing a voltage change when a state of use of the portable telephone is changed from a standby time to a call time in the first embodiment of the present invention.

FIG. 3 is an example of a reference table indicating a relation between the remaining capacity level Q and the output voltage V set for each output voltage value of the secondary battery 31. The information of the reference table shown in FIG. 3 is recorded in advance together with the reference voltage curve in the nonvolatile storage device of the arithmetic device 42. The reference table shown in FIG. 3 is an example indicating the relation between the remaining capacity level Q and the output voltage V. The remaining capacity level Q may be divided into not only 10 levels but also a different number of levels. The output voltage V does not need to be values shown in the figure, and can be set appropriately for each secondary battery 31. In addition, FIG. 3 shows an example in which a difference between the output voltage in a fully charged state of the secondary battery 31 and the cutoff voltage is divided equally, and the remaining capacity level Q is set such that the output voltage V is at equal intervals. However, the output voltage V does not need to be divided equally. For example, when the secondary battery 31 is discharged with a low load, a time from a fully charged state to reaching of the cutoff voltage Vt may be divided equally, and the output voltage corresponding to a discharged capacity on the reference voltage curve and the remaining capacity level Q may be associated with each other.

The battery remaining capacity calculating method according to the present embodiment will next be described. The power consumption of the portable telephone 11 is characterized in that there are a low consumption mode at a standby time or the like in which mode a load on the battery unit 22 consumes little power and a high consumption mode at a call time or the like in which mode the load on the battery unit 22 consumes high power. Accordingly, in the battery remaining capacity calculating method according to the present embodiment, a remaining capacity calculating method at the standby time in the low consumption mode and a remaining capacity calculating method at a use time such as the call time or the like in the high consumption mode are made different from each other. In addition to the call time, there are various use conditions conceivable in the high consumption mode, for example use conditions where a display unit backlight of the portable telephone 11 is lit and where an electronic mail function is used.

The remaining capacity calculating method in each mode will be described in the following. The output voltage of the secondary battery 31 varies greatly depending on the magnitude of output current and the temperature of a use environment. Therefore, in the high consumption mode in which the portable telephone 11 is used, a battery remaining capacity and the voltage are not in a one-to-one relationship, and there are many discharge characteristics according to the use environment and battery degradation. This is because in a state of current being fed, the voltage is decreased from a voltage in a no-load state according to the current due to the effect of the internal impedance of the secondary battery 31 which impedance changes according to the temperature of the use environment and a state of degradation.

In the low consumption mode in which the portable telephone 11 is not used, on the other hand, the current value is low and the internal impedance of the secondary battery 31 produces little effect, so that the battery remaining capacity and the voltage are in substantially a one-to-one relationship. Therefore, the discharge characteristic can be represented by a single reference voltage curve, and the battery remaining capacity of the secondary battery 31 can be calculated by measuring the voltage value of the secondary battery 31. As described above, the reference voltage curve is obtained by measuring the voltage value in a state of a low current being consumed and then stored in advance as relation between the voltage value and the battery remaining capacity in the nonvolatile storage device of the arithmetic device 42.

That is, in the battery remaining capacity calculating method according to the present embodiment, a so-called voltage method is used as the remaining capacity calculating method at a standby time in the low consumption mode. The battery remaining capacity and the output voltage in a state in which low current is consumed and the internal impedance of the secondary battery 31 produces a little effect as at a standby time can be said to be in substantially a one-to-one relationship. Accordingly, the voltage method is used to calculate the battery remaining capacity at a time of the low consumption mode such as a standby time or the like. Incidentally, whether the portable telephone 11 is at a standby time may be determined by any method. For example, the control unit 32 may receive some signal indicating a standby time from the main body unit 21 of the portable telephone 11 via the communication line 24 to determine that the portable telephone 11 is at a standby time. In addition, a current measuring circuit may detect the value of a consumed current for the determination. Since it suffices for the current measuring circuit used to detect the consumed current to measure a current value, it is not necessary to use a sophisticated current measuring circuit that measures current in a pulse form with high accuracy, for example.

Since the discharge characteristic in the low consumption mode can be represented by a single reference voltage curve, a capacity of discharge characteristic information recorded in the nonvolatile storage device of the arithmetic device 42 can be reduced. It is thus possible to reduce the storage capacity of the nonvolatile storage device and reduce the cost of manufacturing the arithmetic device 42. In addition, when information is exchanged between the main body unit 21 of the portable telephone 11 and the arithmetic device 42 as a method for determining whether the portable telephone 11 is in the low consumption mode or in the high consumption mode, constituent parts of the portable telephone 11 can be simplified. In addition, even when the consumed current is detected to determine whether the portable telephone 11 is in the low consumption mode or in the high consumption mode, measurement with high accuracy is not required, and thus the cost of manufacturing the portable telephone 11 can be reduced.

Description will next be made of a remaining capacity calculating method when switching is performed from the low consumption mode at a standby time or the like when the load on the secondary battery 31 is low to the high consumption mode at a call time or the like when the load on the secondary battery 31 is heavy. FIG. 4 is a graph schematically showing voltage change when a state of use of the portable telephone 11 is changed from a standby time to a call time. Since the standby time represents the low consumption mode in which low current is consumed and there is little voltage change, a change satisfying the relation between the voltage value and the battery remaining capacity as represented by the reference voltage curve continues. However, when switching is performed to the high consumption mode by starting a call at a certain point in time, the value of the consumed current increases sharply, and therefore the voltage value also changes sharply due to the effect of the internal impedance of the secondary battery 31. The voltage decreases discontinuously at the time of starting the call, and then decreases slowly. This discontinuous decrease in the voltage, which decrease is caused by the effect of the internal impedance of the secondary battery 31 and current value change, can be said to have little relation to change in the battery remaining capacity as a quantity of electricity dischargeable by the secondary battery 31.

On the other hand, the slow decrease in the voltage after the discontinuous decrease in the voltage results from decrease in the battery remaining capacity as the portable telephone 11 consumes power. Accordingly, it is assumed that the discontinuous decrease in the voltage at the moment of switching from the low consumption mode to the high consumption mode does not change the battery remaining capacity of the secondary battery 31, and the battery remaining capacity is calculated ignoring current consumption at the time of switching of the power consumption mode.

Description will next be made of the remaining capacity calculating method in the high consumption mode at a call time or the like when the load on the secondary battery 31 is heavy. As shown in FIG. 4, in the high consumption mode, the secondary battery 31 discharges and power is consumed by the main body unit 21 of the portable telephone 11, whereby the battery remaining capacity is decreased. The power consumption of the main body unit 21 is performed in a pulse-like manner in nature, and thus the value of the output voltage varies violently. However, when voltage values for a certain time are averaged, the voltage decreases describing a gentle curve as shown in FIG. 4. Accordingly, the battery remaining capacity is calculated on the basis of a start voltage Vn as the output voltage at a time of a start of the high consumption mode and the cutoff voltage Vt.

As described with reference to FIG. 4, it is assumed in the present embodiment that a discontinuous- voltage change when switching is performed from the low consumption mode to the high consumption mode does not affect change in the battery remaining capacity. Remaining capacity levels Qn before and after the discontinuous voltage change are therefore considered to be the same. Hence, the remaining capacity level at the start voltage Vn at the time of the start of the high consumption mode is set as Qn obtained from the reference voltage curve shown in FIG. 2 and the reference table shown in FIG. 3. The cutoff voltage Vt at which the discharging of the secondary battery 31 is stopped is the same in both the low consumption mode and the high consumption mode, and thus the remaining capacity level at the cutoff voltage Vt is set to zero.

When the value of the output voltage in the high consumption mode is considered to be decreased to the cutoff voltage Vt at a substantially fixed rate as shown in FIG. 4, remaining capacity levels are set by equally dividing a difference between the start voltage Vn and the cutoff voltage Vt. Thus, when the output voltage of the secondary battery 31 is Vm, the remaining capacity level Qm during use of the portable telephone 11 in the high consumption mode can be calculated by the following equation using (Vn−Vm) as a range of decrease in the high consumption mode. An operation of rounding off the remaining capacity level Qm to the nearest whole number after calculating the remaining capacity level Qm, for example, may be performed.

$$Qm = Qn - Qn\frac{(Vn-Vm)}{(Vn-Vt)} = Qn\left(\frac{Vm-Vt}{Vn-Vt}\right) \qquad \text{Equation 1}$$

While FIG. 4 shows a case in which the output voltage is decreased at a fixed rate, the remaining capacity level Qm can be calculated from Equation 1 on the basis of the start voltage Vn at the time of the start of the high consumption mode and the cutoff voltage Vt also when the output voltage in the high consumption mode is expressed by v=f(t) as a function of time t. In addition, while Equation 1 represents a case where the difference between the start voltage Vn and the cutoff voltage Vt is divided equally, a ratio for dividing the remaining capacity level in a range from the start voltage Vn to the cutoff voltage Vt may be represented by a reference table or a function and calculated.

The battery remaining capacity calculating method according to the present embodiment does not require many discharge characteristic graphs also when the remaining capacity level in the high consumption mode is calculated. Therefore a capacity of discharge characteristic information recorded in the nonvolatile storage device of the arithmetic device 42 can be reduced. It is thus possible to reduce the storage capacity of the nonvolatile storage device and reduce the cost of manufacturing the arithmetic device 42.

At this time, for example, a change in the use mode of the electronic device connected to the battery may be detected to calculate the voltage change caused by the current value change at the time of mode switching from voltages before and after the change in the use mode of the electronic device. Alternatively, a point of discontinuity of the voltage change may be detected as shown in FIG. 4 to calculate the voltage change from voltages before and after the point of discontinuity. Alternatively, as described above, a current measuring circuit may detect the value of consumed current so that the voltage change is determined on the basis of a capacity of change in the value of the consumed current.

A process for calculating the remaining capacity of the secondary battery 31 by the control unit 32 will next be described with reference to a flowchart of FIG. 5. Incidentally, suppose that information such as the reference voltage curve shown in FIG. 2, the reference table shown in FIG. 3, the cutoff voltage Vt and the like is recorded in the nonvolatile storage device of the arithmetic device 42. Also suppose that the operation of the process to be described below is repeated periodically during use of the portable telephone 11. For example, the operation is repeated with a frequency of once in 10 seconds, for example, so that the latest remaining capacity level is always calculated and displayed.

Step 1 is a voltage measuring step for measuring the value of output voltage of the secondary battery 31. The voltage measuring device 41 transmits the output voltage Vm measured by the voltage measuring device 41 to the arithmetic device 42. The process proceeds to step 2. At this time, the output voltage Vm obtained by only one measurement performed by the voltage measuring device 41 may be used as it is, or the output voltage Vm may be determined by subjecting measured values to some processing in the arithmetic device 42, for example using, as the output voltage Vm, an average value of output voltages obtained by a plurality of voltage measurements performed during a certain time.

Step 2 is a mode determining step for determining whether the main body unit 21 of the portable telephone 11 is in the low consumption mode or in the other mode, that is, the high consumption mode. When the arithmetic device 42 determines that the main body unit 21 of the portable telephone 11 is in the low consumption mode, the process proceeds to step 3. When the arithmetic device 42 determines that the main body unit 21 of the portable telephone 11 is in other than the low consumption mode, the process proceeds to step 4. Whether the main body unit 21 of the portable telephone 11 is in the low consumption mode may be determined by any determining method. For example, the control unit 32 may receive some signal indicating a standby time from the main body unit 21 of the portable telephone 11 via the communication line 24 to determine that the portable telephone 11 is at a standby time. In addition, a current measuring circuit may detect the value of a consumed current for the determination.

Step 3 is a low consumption time remaining capacity calculating step for calculating the remaining capacity level Qm in the low consumption mode. The arithmetic device 42 calculates the remaining capacity level Qm from the output voltage Vm of the secondary battery 31, the output voltage Vm being measured in step 1 as the voltage measuring step, on the basis of the reference voltage curve and the reference table stored in advance in the nonvolatile storage device of the arithmetic device 42. The calculated remaining capacity level Qm is recorded in the volatile storage device. The process then proceeds to step 7.

Step 4 is a current change calculating step for determining whether switching has just been performed from the low consumption mode to the high consumption mode or whether a state of the portable telephone 11 being used in the high consumption mode is maintained. The arithmetic device 42 determines whether the value of current output from the secondary battery 31 is changed, that is, whether the use mode of the portable telephone 11 is changed. When the arithmetic device 42 determines that the value of the current is changed, the process proceeds to step 5. When the arithmetic device 42 determines that the value of the current is not changed, the process proceeds to step 6. Incidentally, whether the value of the current is changed may be determined by any determining method. For example, the control unit 32 may receive some signal indicating a change in the use mode from the main body unit 21 of the portable telephone 11 via the communication line 24 to determine that the value of the current is changed. In addition, a current measuring circuit may be used to detect the value of the current output from the secondary battery 31 for the determination. Since it suffices for the current measuring circuit used to detect the current to measure a current value, it is not necessary to use a sophisticated current measuring circuit that measures current in a pulse form with high accuracy, for example.

Step 5 is an initializing step performed immediately after the use mode of the portable telephone 11 is changed from the low consumption mode to the high consumption mode. In step 5, a parameter necessary to calculate the remaining capacity level in the high consumption mode is initialized. The arithmetic device 42 sets a remaining capacity level Qn in the low consumption mode immediately before the change in the current as a reference remaining capacity level, and sets a measured voltage Vn immediately after a discontinuous voltage decrease as a start voltage. The arithmetic device 42 records the reference remaining capacity level Qn and the start voltage Vn in the volatile storage device. When the arithmetic device 42 completes the setting and recording of the reference remaining capacity level Qn and the start voltage Vn as the initializing process, the process proceeds to step 6.

Step 6 is a high consumption time remaining capacity calculating step for calculating the remaining capacity level Qm in the high consumption mode. The arithmetic device 42 calculates the remaining capacity level Qm when a measured voltage is Vm from the above-described Equation 1 using the reference remaining capacity level Qn and the start voltage Vn recorded in the volatile storage device and the cutoff voltage Vt recorded in the nonvolatile storage device. After the remaining capacity level Qm is recorded in the volatile storage device, the process proceeds to step 7. A difference between the start voltage Vn and the measured voltage Vm is a voltage change caused by a change in the remaining capacity. In the present embodiment, the remaining capacity level Qm is calculated ignoring the voltage change when switching is performed from the low consumption mode to the high consumption mode. The values of the reference remaining capacity level Qn and the start voltage Vn used in this step are recorded in the nonvolatile storage device in step 5. When the process proceeds from step 4 to step 6, the reference remaining capacity level Qn and the start voltage Vn set in step 5 as the initializing step performed most recently are used.

Step 7 is a remaining capacity displaying step for displaying the calculated remaining capacity Qm on the main body unit 21 of the portable telephone 11. The arithmetic device 42 transmits the information of the remaining capacity level Qm calculated in step 3 or step 6 and recorded in the volatile storage device to the main body unit 21 via the communication line 24. The information of the remaining capacity level Qm is displayed on the display device of the main body unit 21 so that the remaining capacity level Qm of the secondary battery 31 is notified to a user. Incidentally, in addition to stepwise level display of the remaining capacity level Qm, time display of a maximum standby time, a maximum calling time or the like may be made on the basis of the remaining capacity level.

The battery remaining capacity calculating method according to the present embodiment does not require many discharge characteristic graphs both when the remaining capacity in the low consumption mode is calculated and when the remaining capacity level in the high consumption mode is calculated. Therefore a capacity of discharge characteristic information recorded in the nonvolatile storage device of the arithmetic device 42 can be reduced. It is thus possible to reduce the storage capacity of the nonvolatile storage device and reduce the cost of manufacturing the arithmetic device 42.

Second Embodiment

A method of calculating a battery remaining capacity using an identical reference voltage curve both in a low consumption mode and in a high consumption mode according to a second embodiment of the present embodiment will be described with reference to FIG. 6 and FIG. 7. A battery remaining capacity calculating method according to the present embodiment and the battery remaining capacity calculating method according to the first embodiment differ only in the method of calculating a battery remaining capacity in the high consumption mode. Therefore suppose that a configuration of a portable telephone, a reference voltage curve, and a reference table between remaining capacity levels and voltage values, for example, described with reference to FIGS. 1 to 3 are the same as in the first embodiment.

Description will next be made of the battery remaining capacity calculating method according to the present embodiment. The power consumption of a portable telephone 11 is characterized in that there are a low consumption mode at a standby time or the like in which mode a load on a battery unit 22 consumes little power and a high consumption mode at a call time or the like in which mode the load on the battery unit 22 consumes high power. Accordingly, in the battery remaining capacity calculating method according to the present embodiment, a remaining capacity calculating method at the standby time in the low consumption mode and a remaining capacity calculating method at a use time such as the call time or the like in the high consumption mode are made different from each other. In addition to the call time, there are various use conditions conceivable in the high consumption mode, for example use conditions where a display unit backlight of the portable telephone 11 is lit and where an electronic mail function is used.

The remaining capacity calculating method in each mode will be described in the following. The output voltage of the secondary battery 31 varies greatly depending on the magnitude of output current and the temperature of a use environment. Therefore, in the high consumption mode in which the portable telephone 11 is used, a battery remaining capacity and the voltage are not in a one-to-one relationship, and there are many discharge characteristics according to the use environment and battery degradation. This is because in a state of current being fed, the voltage is decreased from a voltage in a no-load state according to the current due to the effect of the internal impedance of a secondary battery 31 which impedance changes according to the temperature of the environment.

In the low consumption mode in which the portable telephone 11 is not used, on the other hand, the current value is low and the internal impedance of the secondary battery 31 produces little effect, so that the battery remaining capacity and the voltage are in substantially a one-to-one relationship. Therefore, the discharge characteristic can be represented by a single reference voltage curve, and the battery remaining capacity of the secondary battery 31 can be calculated by measuring the voltage value of the secondary battery 31. As described above, the reference voltage curve is obtained by measuring the voltage value in a state of a low current being consumed and then stored in advance as relation between the voltage value and the battery remaining capacity in the nonvolatile storage device of an arithmetic device 42. The reference voltage curve is shown in the graph of FIG. 2.

That is, in the battery remaining capacity calculating method according to the present embodiment, a so-called voltage method is used as the remaining capacity calculating method at a standby time in the low consumption mode. The battery remaining capacity and the output voltage in a state in which low current is consumed and the internal impedance of the secondary battery 31 produces a little effect as at a standby time can be said to be in substantially a one-to-one relationship. Accordingly, the voltage method is used to calculate the battery remaining capacity at a time of the low consumption mode such as a standby time or the like. Incidentally, whether the portable telephone 11 is at a standby time may be determined by any method. For example, a control unit 32 may receive some signal indicating a standby time from the main body unit 21 of the portable telephone 11 via a communication line 24 to determine that the portable telephone 11 is at a standby time.

In addition, a current measuring circuit may detect the value of a consumed current for the determination. Since it suffices for the current measuring circuit used to detect the consumed current to measure a current value, it is not necessary to use a sophisticated current measuring circuit that measures current in a pulse form with high accuracy, for example.

Since the discharge characteristic in the low consumption mode can be represented by a single reference voltage curve, a capacity of discharge characteristic information recorded in the nonvolatile storage device of the arithmetic device 42 can be reduced. It is thus possible to reduce the storage capacity of the nonvolatile storage device and reduce the cost of manufacturing of the arithmetic device 42. In addition, when information is exchanged between the main body unit 21 of the portable telephone 11 and the arithmetic device 42 as a method for determining whether the portable telephone 11 is in the low consumption mode or in the high consumption mode, constituent parts of the portable telephone 11 can be simplified. In addition, even when the consumed current is detected to determine whether the portable telephone 11 is in the low consumption mode or in the high consumption mode, measurement with high accuracy is not required, and thus the cost of manufacturing the portable telephone 11 can be reduced.

Description will next be made of a remaining capacity calculating method when switching is performed from the low consumption mode at a standby time or the like when the load on the secondary battery 31 is low to the high consumption mode at a call time or the like when the load on the secondary battery 31 is heavy. FIG. 6 is a graph schematically showing voltage change when a state of use of the portable telephone 11 is changed from a standby time to a call time. Since the standby time represents the low consumption mode in which low current is consumed and there is little voltage change, a change satisfying the relation between the voltage value and the battery remaining capacity as represented by the reference voltage curve continues. However, when switching is performed to the high consumption mode by starting a call at a certain point in time, the value of the consumed current increases sharply, and therefore the voltage value also changes sharply due to the effect of the internal impedance of the secondary battery 31. The voltage decreases discontinuously at the time of starting the call, and then decreases slowly. This discontinuous decrease in the voltage, which decrease is caused by the effect of the internal impedance of the secondary battery 31 and current value change, can be said to have little relation to change in the battery remaining capacity as a quantity of electricity dischargeable by the secondary battery 31.

On the other hand, the slow decrease in the voltage after the discontinuous decrease in the voltage results from decrease in the battery remaining capacity as the portable telephone 11 consumes power. Accordingly, it is assumed that the discontinuous decrease in the voltage at the moment of switching from the low consumption mode to the high consumption mode does not change the battery remaining capacity of the secondary battery 31, and the battery remaining capacity is calculated ignoring current consumption at the time of switching of the power consumption mode.

Description will next be made of the remaining capacity calculating method in the high consumption mode at a call time or the like when the load on the secondary battery 31 is heavy. As shown in FIG. 6, in the high consumption mode, the secondary battery 31 discharges and power is consumed by the main body unit 21 of the portable telephone 11, whereby the battery remaining capacity is decreased. The power consumption of the main body unit 21 is performed in a pulse-like manner in nature, and thus the value of the output voltage varies violently. However, when voltage values for a certain time are averaged, the voltage decreases describing a gentle curve as shown in FIG. 6. Accordingly, the battery remaining capacity is calculated on the basis of a start voltage Vn2 as the output voltage at a time of a start of the high consumption mode and a voltage gap $\Delta V$ representing a change at the time of the discontinuous decrease in the voltage.

As described with reference to FIG. 6, it is assumed in the present embodiment that a discontinuous voltage change when switching is performed from the low consumption mode to the high consumption mode does not affect change in the battery remaining capacity. Remaining capacity levels Qn2 before and after the discontinuous voltage change are therefore considered to be the same. Hence, the remaining capacity level at the start voltage Vn2 at the time of the start of the high consumption mode is set as Qn2 obtained from the reference voltage curve shown in FIG. 2 and the reference table shown in FIG. 3.

Figure 6:
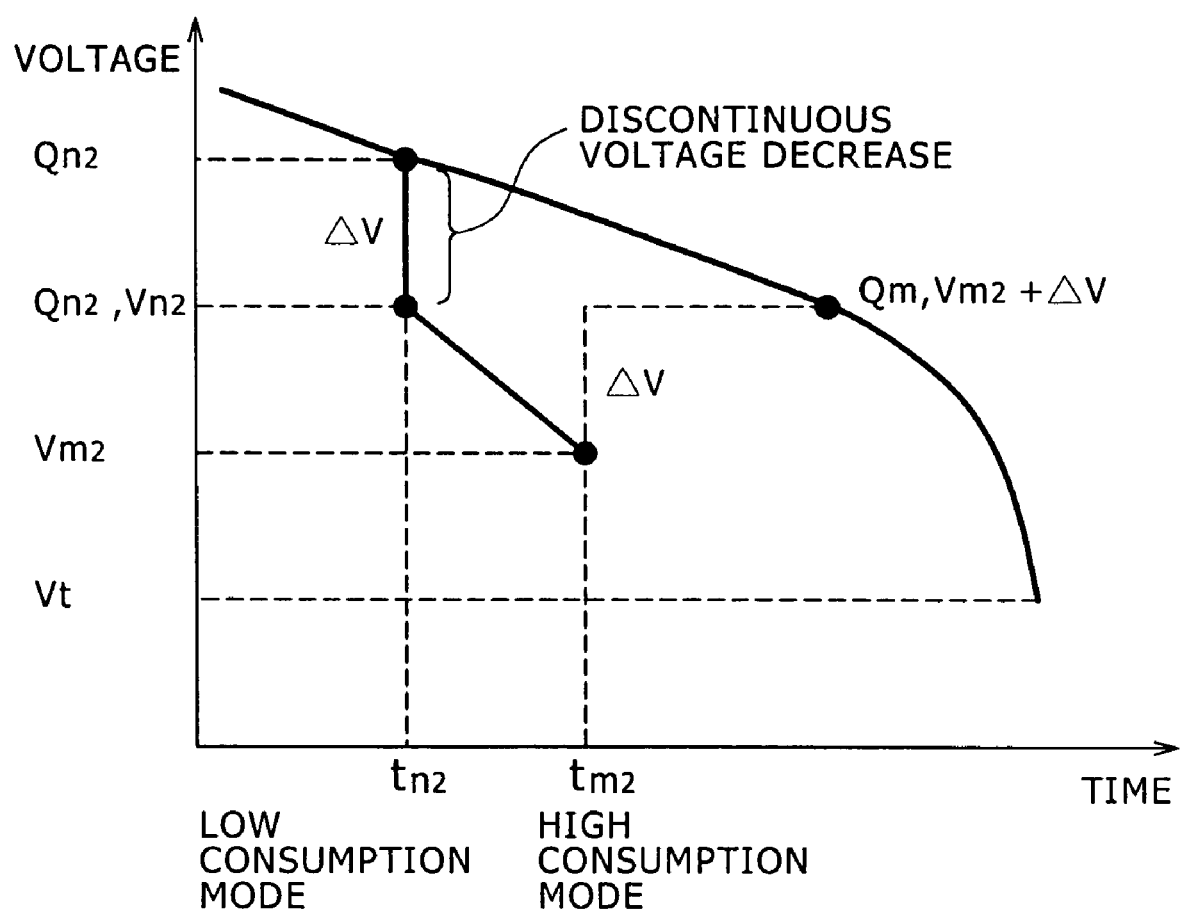
FIG. 6 is a graph schematically showing a voltage change when a state of use of the portable telephone is changed from a standby time to a call time in a second embodiment of the present invention.
Figure 7:
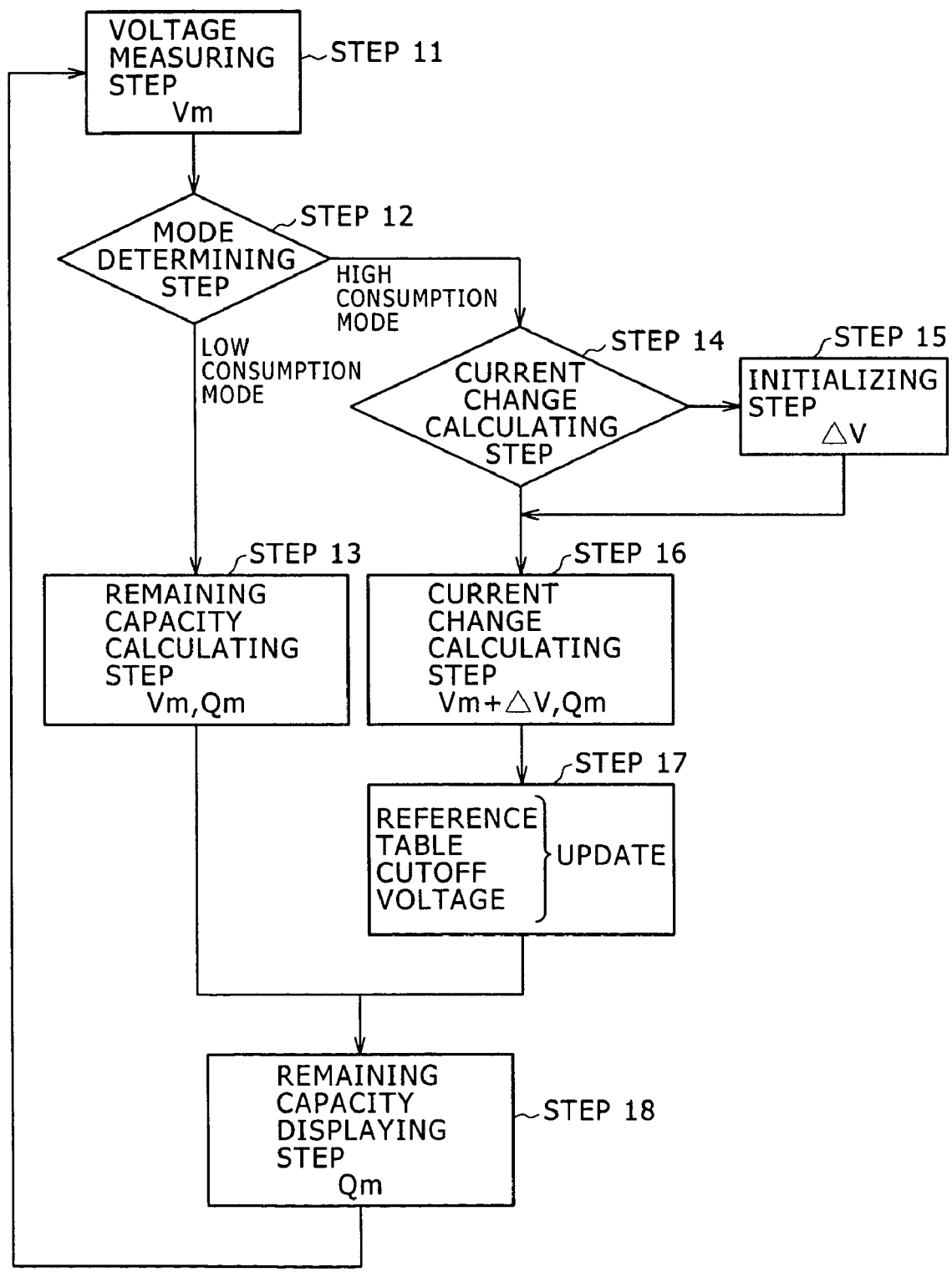
FIG. 7 is a flowchart of assistance in explaining a process for calculating the remaining capacity of a secondary battery in the second embodiment of the present invention.

As shown in FIG. 6, in the present embodiment, a capacity of discontinuous voltage change occurring when switching is performed from the low consumption mode to the high consumption mode at time tn2 is set as voltage gap $\Delta V$, and current consumption at the time of the mode change is ignored. A voltage measuring device 41 measures the output voltage of the secondary battery 31 at time tm2 in the high consumption mode. A remaining capacity level Qm is calculated on the basis of the value Vm2 of the measured voltage and the voltage gap $\Delta V$.

The voltage gap $\Delta V$ is a voltage decrease caused by the effects of the internal impedance of the secondary battery 31 and the value of output current. Therefore the measured voltage value Vm2 is considered to result from the voltage decrease corresponding to the voltage gap $\Delta V$ from the discharge characteristic represented by the reference voltage curve. Accordingly, in the present embodiment, the remaining capacity level Qm corresponding to an addition voltage value (Vm2+$\Delta V$) obtained by adding the voltage gap $\Delta V$ to the voltage value Vm2 is calculated from the reference voltage curve and the reference table. Specifically, when the measured voltage value is Vm2, the remaining capacity level Qm is considered to be a remaining capacity level at a point where the voltage of the reference voltage curve is at the addition voltage value (Vm2+$\Delta V$). A remaining capacity level corresponding to the addition voltage value (Vm2+$\Delta V$) is set as Qm on the basis of the reference table shown in FIG. 3. In this case, however, the reference table shown in FIG. 3 is updated by changing combinations of remaining capacity levels and voltages in the reference table so that a remaining capacity level at a voltage value (Vt+$\Delta V$) obtained by adding the voltage gap $\Delta V$ to a cutoff voltage Vt is zero. In addition, the voltage value (Vt+$\Delta V$) is updated as a new cutoff voltage Vt.

Incidentally, while in the second embodiment, the voltage gap $\Delta V$ is calculated from a discontinuous voltage change at the time of a start of the high consumption mode, the voltage gap $\Delta V$ may be obtained as a product of the internal impedance R of the secondary battery and a current value I in the high consumption mode. In this case, the internal impedance R of the secondary battery may be measured by any method. It is desirable that the voltage gap $\Delta V$ used to obtain the addition voltage value at which the remaining capacity level is zero be a product of a maximum current value in the high consumption mode and the internal impedance.

The battery remaining capacity calculating method according to the present embodiment does not require many discharge characteristic graphs when the remaining capacity level in the high consumption mode is calculated. Therefore a capacity of discharge characteristic information recorded in the nonvolatile storage device of the arithmetic device 42 can be reduced. It is thus possible to reduce the storage capacity of the nonvolatile storage device and reduce the cost of manufacturing of the arithmetic device 42.

At this time, for example, a change in the use mode of the electronic device connected to the battery may be detected to calculate a voltage change caused by a current value change at the time of mode switching from voltages before and after the change in the use mode of the electronic device. Alternatively, a point of discontinuity of the voltage change may be detected as shown in FIG. 4 to calculate the voltage change from voltages before and after the point of discontinuity. Alternatively, as described above, a current measuring circuit may detect the value of consumed current so that the voltage change is determined on the basis of a capacity of change in the value of the consumed current.

A process for calculating the remaining capacity of the secondary battery 31 by the control unit 32 will next be described with reference to a flowchart of FIG. 7. Incidentally, suppose that information such as the reference voltage curve shown in FIG. 2, the reference table shown in FIG. 3, the cutoff voltage Vt and the like is recorded in the nonvolatile storage device of the arithmetic device 42. Also suppose that the operation of the process to be described below is repeated periodically during use of the portable telephone 11. For example, the operation is repeated with a frequency of once in 10 seconds, for example, so that the latest remaining capacity level is always calculated and displayed.

Step 11 is a voltage measuring step for measuring the value of output voltage of the secondary battery 31. The voltage measuring device 41 transmits an output voltage Vm2 measured by the voltage measuring device 41 to the arithmetic device 42. The process proceeds to step 12.

Step 12 is a mode determining step for determining whether the main body unit 21 of the portable telephone 11 is in the low consumption mode or in the other mode, that is, the high consumption mode. When the arithmetic device 42 determines that the main body unit 21 of the portable telephone 11 is in the low consumption mode, the process proceeds to step 13. When the arithmetic device 42 determines that the main body unit 21 of the portable telephone 11 is in other than the low consumption mode, the process proceeds to step 14.

Step 13 is a low consumption time remaining capacity calculating step for calculating a remaining capacity level Qm in the low consumption mode. The arithmetic device 42 calculates the remaining capacity level Qm from the output voltage Vm2 of the secondary battery 31, the output voltage Vm2 being measured in step 11 as the voltage measuring step, on the basis of the reference voltage curve and the reference table stored in advance in the nonvolatile storage device of the arithmetic device 42. The calculated remaining capacity level Qm is recorded in the volatile storage device. The process then proceeds to step 18.

Step 14 is a current change calculating step for determining whether switching has just been performed from the low consumption mode to the high consumption mode or whether a state of the portable telephone 11 being used in the high consumption mode is maintained. The arithmetic device 42 determines whether the value of current output from the secondary battery 31 is changed, that is, whether the use mode of the portable telephone 11 is changed. When the arithmetic device 42 determines that the value of the current is changed, the process proceeds to step 15. When the arithmetic device 42 determines that the value of the current is not changed, the process proceeds to step 16.

Step 15 is an initializing step performed immediately after the use mode of the portable telephone 11 is changed from the low consumption mode to the high consumption mode. In step 15, a parameter necessary to calculate the remaining capacity level in the high consumption mode is initialized. The arithmetic device 42 sets a difference between a measured voltage in the low consumption mode immediately before the change in the current and a measured voltage in the high consumption mode immediately after the change in the current as a voltage gap $\Delta V$. The arithmetic device 42 records the voltage gap $\Delta V$ in a volatile storage device. When the arithmetic device 42 completes the setting and recording of the voltage gap $\Delta V$ as the initializing process, the process proceeds to step 16.

Step 16 is a high consumption time remaining capacity calculating step for calculating the remaining capacity level Qm in the high consumption mode. The arithmetic device 42 adds the voltage gap $\Delta V$ to the measured voltage Vm2, and calculates the remaining capacity level Qm when the measured voltage is Vm using the reference voltage curve and the reference table recorded in the nonvolatile storage device. After the remaining capacity level Qm is recorded in the volatile storage device, the process proceeds to step 17. The value of the voltage gap $\Delta V$ used in this step is recorded in the nonvolatile storage device in step 15. When the process proceeds from step 14 to step 16, the voltage gap $\Delta V$ set in step 15 as the initializing step performed most recently is used.

Step 17 is a reference table updating step for rewriting the reference table representing combinations of remaining capacity levels and voltages and the cutoff voltage Vt, the reference table and the cutoff voltage Vt being recorded in the nonvolatile storage device. In this step, the reference table recorded in the nonvolatile storage device is updated by changing the combinations of remaining capacity levels and voltages in the reference table such that a remaining capacity level at a voltage value (Vt+$\Delta V$) obtained by adding the voltage gap $\Delta V$ to the cutoff voltage Vt is zero. In addition, the cutoff voltage Vt is updated by recording the voltage value (Vt+$\Delta V$) as a new cutoff voltage Vt in the nonvolatile storage device. After the reference table and the cutoff voltage Vt are updated, the process proceeds to step 18.

Step 18 is a remaining capacity displaying step for displaying the calculated remaining capacity Qm on the main body unit 21 of the portable telephone 11. The arithmetic device 42 transmits the information of the remaining capacity level Qm calculated in step 13 or step 16 and recorded in the volatile storage device to the main body unit 21 via the communication line 24. The information of the remaining capacity level Qm is displayed on the display device of the main body unit 21 so that the remaining capacity level Qm of the secondary battery 31 is notified to a user.

The present embodiment extracts only a voltage change caused by a decrease in the battery remaining capacity by removing a voltage change at the time of change from the low consumption mode to the high consumption mode, and calculates a remaining capacity level from the voltage change caused by the decrease in the battery remaining capacity. Thus, by removing the effect of the voltage change due to the internal impedance affected by the temperature and a state of degradation, it is possible to calculate the remaining capacity level accurately.

FIRST EXAMPLE

Data on an experiment using the battery remaining capacity calculating method illustrated in the first embodiment will be described as an example of the present invention. A portable telephone used in the experiment is a multi-function portable telephone including a 2-inch liquid crystal display and having a function of information communication. This portable telephone includes a lithium-ion secondary battery with a nominal voltage of 3.7 V, a capacity of 730 mAh, a full charge voltage of 4.2 V and a cutoff voltage of 3.55 V. The portable telephone is operated on an output from the lithium-ion secondary battery. In the present example, a remaining capacity is displayed on a scale of 10, which is more detailed than currently common three-level display. That is, the remaining capacity is displayed with 10 as a remaining capacity in a full charge state and zero as a remaining capacity in a state in which the portable telephone cannot be used. Incidentally, the remaining capacity may be displayed in more detail than on the scale of 10. Also, time display of a maximum standby time, a maximum calling time or the like may be made on the basis of the ratio of the remaining capacity.

First, in order to measure relation between voltage during a standby time and the remaining capacity, the lithium-ion secondary battery was connected to a charging and discharging device that charges and discharges the secondary battery. After the secondary battery was charged to a fully charged state, a discharged capacity and the voltage were measured while the secondary battery was discharged with a low current of 5 mA. Relation between a remaining capacity level and the voltage was obtained from relation between the discharged capacity and the voltage. Based on this data, combinations of 10 remaining capacity levels and the voltage were stored as a reference table as shown in FIG. 3 in the nonvolatile storage device of an arithmetic device.

The lithium-ion secondary battery was connected to the portable telephone. Voltage during actual use of the portable telephone was converted into a digital value by a 16-bit AD converter, and sequentially taken into the arithmetic device. A voltage measuring frequency was 1 kHz. The remaining capacity was calculated using, as a measured voltage Vm, a voltage obtained by averaging data for one second, that is, 1000 voltages. Incidentally, by averaging the data for one second, effects of pulse-like voltage change occurring at a standby time can be removed.

In the present example, whether the portable telephone was in a low consumption mode at a standby time was determined by measuring current. It is determined that the portable telephone is at a standby time when the measured current is 30 mA as a threshold voltage or lower. Incidentally, a current measuring circuit necessary for this does not need to be a high-precision circuit; it suffices for the current measuring circuit to be able to determine whether or not a current having a certain value or higher flows. It is determined that a change from a standby state to a non-standby state is made when a change in the current occurs.

In the present example, when it was determined that a change in the current occurred, a remaining capacity one second before the change in the current was stored as a reference remaining capacity level Qn in a volatile storage device, and an average voltage for 30 seconds after the change in the current was stored as a start voltage Vn in the volatile storage device. A remaining capacity level Qm was calculated by substituting the reference remaining capacity level Qn and the start voltage Vn stored in the volatile storage device, the cutoff voltage of 3.55 V, and present measured voltage Vm into Equation 1 as Q=Qn−Qn×(Vn−Vm)/(Vn−3.55). FIG. 8 shows images imitating a battery, for displaying the remaining capacity level Qm on a main body unit. FIG. 8 shows an example in which for easy identification of the remaining capacity level Qm by a user, an inside of a frame representing the external shape of the battery is divided into nine parts, and a display area is changed according to the remaining capacity level Qm.

Figure 5:
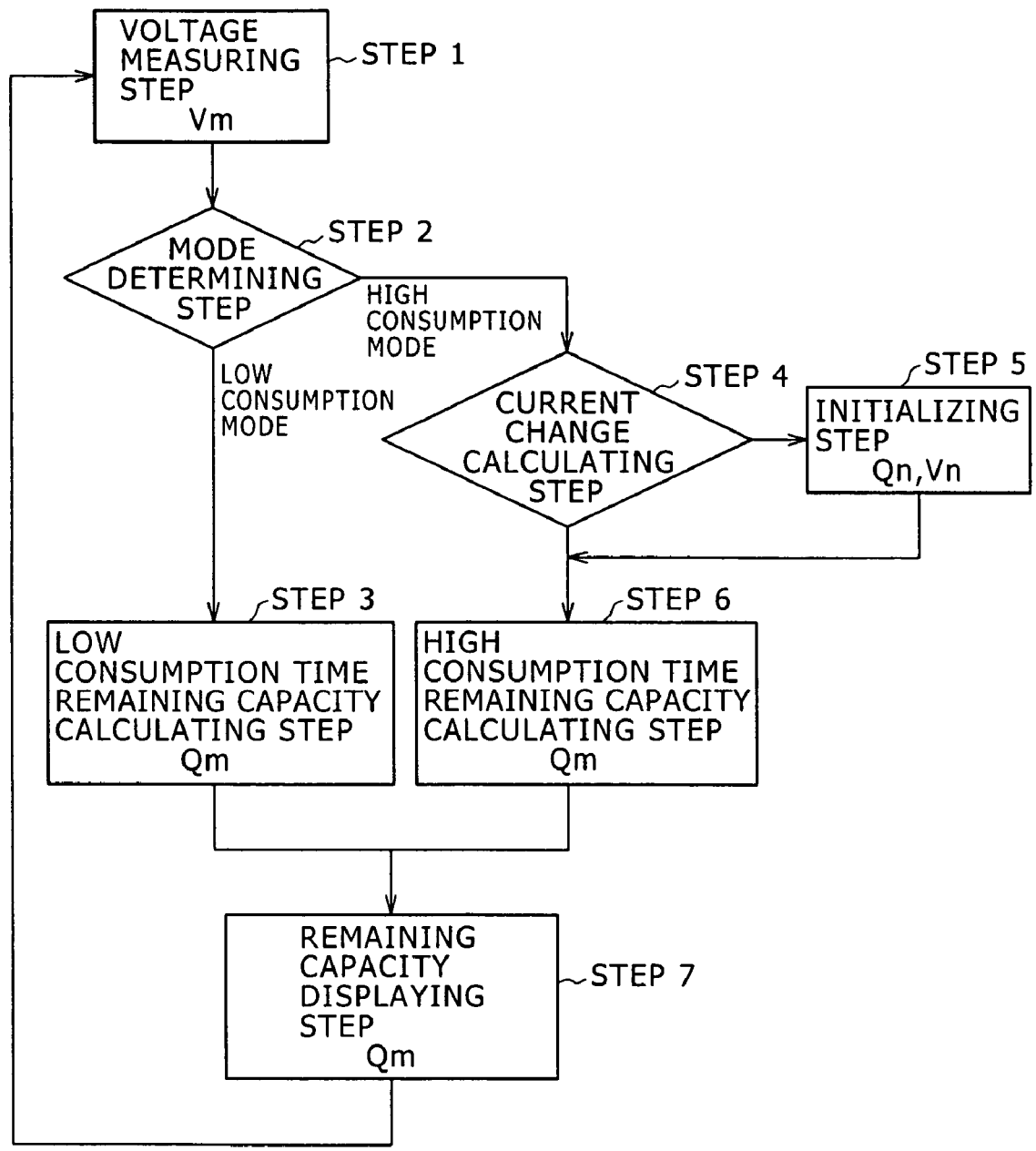
FIG. 5 is a flowchart of assistance in explaining a process for calculating the remaining capacity of the secondary battery in the first embodiment of the present invention.
Figure 9:
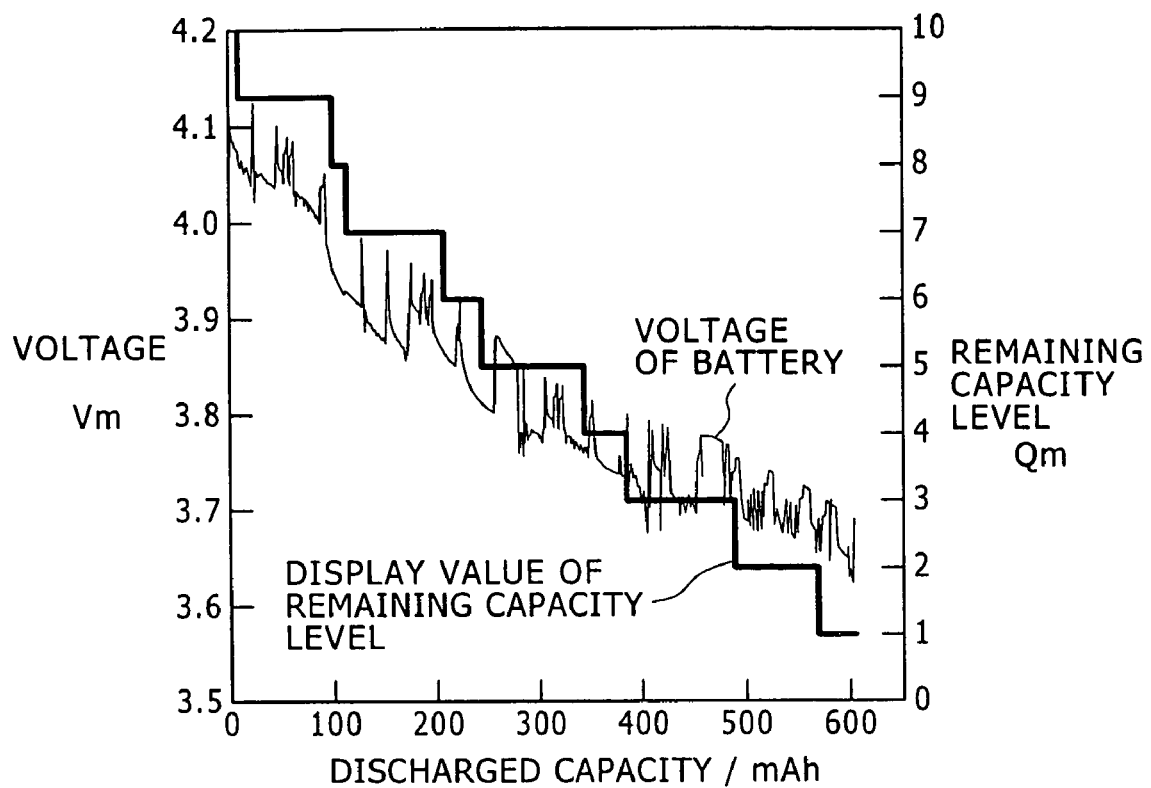
FIG. 9 is a graph showing relation between voltage Vm measured in the first example of the present invention and the display value of the remaining capacity level Qm.
Figure 10:
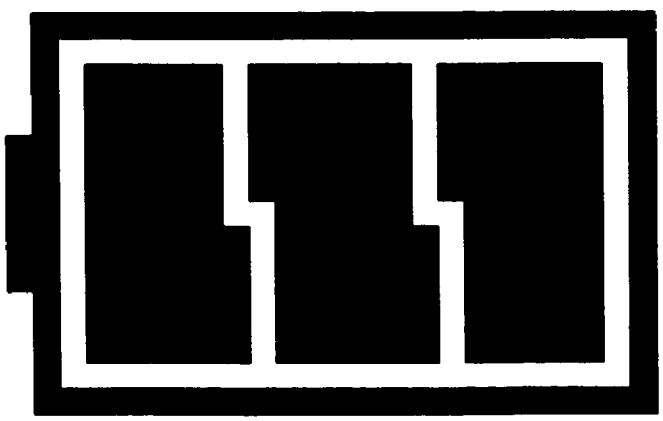
FIG. 10 is a diagram showing an example of remaining capacity display in an electronic device using a conventional secondary battery.

The remaining capacity was calculated while the flowchart of FIG. 5 as the battery remaining capacity calculating method according to the present invention as described above was sequentially repeated, so that the latest remaining capacity was always displayed for the user. FIG. 9 is a graph showing relation between the display value of the remaining capacity level Qm and the measured voltage Vm. An axis of abscissas in FIG. 9 indicates the integrated value of a capacity of electricity discharged by the lithium-ion secondary battery. A line repeating pulse-like variations in FIG. 9 represents the voltage value of the lithium-ion secondary battery. A line changing stepwise in FIG. 9 represents the display value of the remaining capacity level Qm.

As shown in FIG. 9, the display value of the remaining capacity level is decreased according to the capacity of electricity discharged by the lithium-ion secondary battery. Thus, the remaining capacity level Qm of the lithium-ion secondary battery can be calculated highly accurately and minutely.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A battery remaining capacity calculating method for calculating a remaining capacity as a capacity of electricity dischargeable by a secondary battery, said battery remaining capacity calculating method comprising:
   measuring an output voltage value of said secondary battery;
   dividing a battery capacity consumption mode of said secondary battery into a high consumption rate mode in which the output voltage value is not lower than a voltage threshold value and a low consumption rate mode in which the output voltage value is lower than the voltage threshold value;
   calculating a remaining capacity in said low consumption rate mode on a basis of a predetermined nonlinear reference voltage curve as a discharge characteristic of said secondary battery and said output voltage value; and
   calculating a remaining capacity in said high consumption rate mode supposing that there is minimal change in the remaining capacity at a time of change from said low consumption rate mode to said high consumption rate mode,
   determining the battery capacity consumption mode is independent of a measured temperature of the secondary battery.

2. The battery remaining capacity calculating method as claimed in claim 1, further comprising:
   setting a reference remaining capacity as a remaining capacity before the battery capacity consumption mode change and a start voltage as an output voltage at a time of a start of the high consumption rate mode, wherein a remaining capacity is calculated on a basis of said reference remaining capacity, said start voltage, a predetermined cutoff voltage of said secondary battery, and said output voltage value.

3. The battery remaining capacity calculating method as claimed in claim 2, wherein the remaining capacity Qm in said high consumption rate mode is calculated by an equation $$Qm = Qn - Qn\frac{(Vn-Vm)}{(Vn-Vt)} = Qn\left(\frac{Vm-Vt}{Vn-Vt}\right)$$

using the reference remaining capacity Qn, the start voltage Vn, the cutoff voltage Vt, and the output voltage value Vm.

4. The battery remaining capacity calculating method as claimed in claim 1, further comprising:
   setting a voltage gap as an output voltage change at the time of the battery capacity consumption mode change, wherein a remaining capacity is calculated on a basis of said voltage gap and said output voltage value.

5. The battery remaining capacity calculating method as claimed in claim 4, wherein an addition voltage value (Vm+ΔV) is calculated by adding said voltage gap ΔV to said output voltage value Vm, and a remaining capacity at said addition voltage value (Vm+ΔV) on said reference voltage curve is set as the remaining capacity Qm in the high consumption rate mode.

6. The battery remaining capacity calculating method as claimed in claim 1, further comprising:
   determining that the battery capacity consumption mode has changed to a high consumption rate mode if a change in current consumption is positive and if a rate of change of current consumption exceeds a use mode switching threshold;

determining that the battery capacity consumption mode has changed to a low consumption rate mode if a change in current consumption is negative and if a rate of change of current consumption exceeds a use mode switching threshold.

7. The battery remaining capacity calculating method as claimed in claim 1, wherein whether said secondary battery is in said low consumption rate mode or in said high consumption rate mode is determined by detecting a change in output voltage of said secondary battery.

8. The battery remaining capacity calculating method as claimed in claim 1, wherein whether said secondary battery is in said low consumption rate mode or in said high consumption rate mode is determined on a basis of information from an electronic device side to which said secondary battery supplies power.

9. A battery remaining capacity calculating device for calculating a remaining capacity as a capacity of electricity dischargeable by a secondary battery, said battery remaining capacity calculating device comprising:

voltage measuring means for measuring an output voltage value of said secondary battery; and arithmetic means for performing information processing, a reference voltage curve as a discharge characteristic of said secondary battery being recorded in said arithmetic means;

said arithmetic means divides a use battery capacity consumption mode of said secondary battery into a high consumption rate mode in which the output voltage value is not lower than a threshold value and a low consumption rate mode in which the output voltage value is lower than the threshold value, said arithmetic means calculates a remaining capacity of said secondary battery in said low consumption rate mode on a basis of the voltage value measured by said voltage measuring means and said reference voltage curve, and said arithmetic means calculates a remaining capacity in said high consumption rate mode on a basis of a reference remaining capacity as a remaining capacity before a battery capacity consumption mode change, a start voltage as an output voltage at a time of a start of the high consumption rate mode, a predetermined cutoff voltage of said secondary battery, and said output voltage value, determining the battery capacity consumption mode is independent of a measured temperature of the secondary battery.

10. The battery remaining capacity calculating device as claimed in claim 9, wherein said arithmetic means calculates the remaining capacity Qm in said high consumption rate mode by an equation $$Qm = Qn - Qn\frac{(Vn-Vm)}{(Vn-Vt)} = Qn\left(\frac{Vm-Vt}{Vn-Vt}\right)$$

using the reference remaining capacity Qn, the start voltage Vn, the cutoff voltage Vt, and the output voltage value Vm.

11. A battery remaining capacity calculating device for calculating a remaining capacity as a capacity of electricity dischargeable by a secondary battery, said battery remaining capacity calculating device comprising:

voltage measuring means for measuring an output voltage value of said secondary battery; and arithmetic means for performing information processing, a reference voltage curve as a discharge characteristic of said secondary battery being recorded in said arithmetic means;

wherein said arithmetic means divides a use battery capacity consumption mode of said secondary battery into a high consumption rate mode in which the output voltage value is not lower than a threshold value and a low consumption rate mode in which the output voltage value is lower than the threshold value, said arithmetic means calculates a remaining capacity of said secondary battery in said low consumption rate mode on a basis of the voltage value measured by said voltage measuring means and said reference voltage curve, and said arithmetic means calculates a remaining capacity in said high consumption rate mode on a basis of a voltage gap as an output voltage change at a time of a use mode change and said output voltage value, and determining the battery capacity consumption mode is independent of a measured temperature of the secondary battery.

12. The battery remaining capacity calculating device as claimed in claim 11, wherein in said high consumption rate mode, the remaining capacity is calculated on a basis of said reference voltage curve and an addition voltage value (Vm+ΔV) obtained by adding said voltage gap ΔV to said output voltage value Vm.

13. A battery remaining capacity calculating program for calculating a remaining capacity as a capacity of electricity dischargeable by a secondary battery, said battery remaining capacity calculating program comprising making a processor perform:

a voltage measuring step of measuring an output voltage value of said secondary battery;

a mode determining step of dividing a battery capacity consumption mode of said secondary battery into a high consumption rate mode in which the output voltage value is not lower than a threshold value and a low consumption rate mode in which the output voltage value is lower than the threshold value;

a low consumption time remaining capacity calculating step of calculating a remaining capacity in said low consumption rate mode on a basis of a predetermined nonlinear reference voltage curve as a discharge characteristic of said secondary battery and said output voltage value; and a high consumption time remaining capacity calculating step of calculating a remaining capacity in said high consumption rate mode supposing that there is little change in the remaining capacity at a time of change from said low consumption rate mode to said high consumption rate mode, determining the battery capacity consumption mode is independent of a measured temperature of the secondary battery.

14. The battery remaining capacity calculating program as claimed in claim 13, wherein in said high consumption time remaining capacity calculating step, the remaining capacity is calculated on a basis of a reference remaining capacity as a remaining capacity before the use battery capacity consumption mode change, a start voltage as an output voltage at a time of a start of the high consumption rate mode, a predetermined cutoff voltage of said secondary battery, and said output voltage value.

15. The battery remaining capacity calculating program as claimed in claim 13, wherein in said high consumption time remaining capacity calculating step, the remaining capacity is calculated on a basis of a voltage gap as an output voltage change at the time of the battery capacity consumption mode change and said output voltage value.

* * * * *